(12) United States Patent
Zha et al.

(10) Patent No.: US 10,146,082 B2
(45) Date of Patent: Dec. 4, 2018

(54) DISPLAY DEVICES AND THE COLOR FILTERS THEREOF

(71) Applicant: Wuhan China Star Optoelectronics Technology Co., Ltd., Wuhan, Hubei (CN)

(72) Inventors: Guowei Zha, Guangdong (CN); Hongqing Cui, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 161 days.

(21) Appl. No.: 15/301,340

(22) PCT Filed: Sep. 20, 2016

(86) PCT No.: PCT/CN2016/099415
§ 371 (c)(1),
(2) Date: Sep. 30, 2016

(87) PCT Pub. No.: WO2018/040144
PCT Pub. Date: Mar. 8, 2018

(65) Prior Publication Data
US 2018/0196304 A1    Jul. 12, 2018

(30) Foreign Application Priority Data

Aug. 29, 2016 (CN) .......................... 2016 1 0761251

(51) Int. Cl.
*G02F 1/1335* (2006.01)
*G02B 5/30* (2006.01)
(Continued)

(52) U.S. Cl.
CPC ......... *G02F 1/133514* (2013.01); *G02B 5/20* (2013.01); *G02B 5/3058* (2013.01);
(Continued)

(58) Field of Classification Search
CPC ........... G02F 1/133514; G02F 2201/30; G02F 2201/305; G02F 1/133504;
(Continued)

(56) References Cited

U.S. PATENT DOCUMENTS

2011/0151605 A1* 6/2011 Yoon ................... G02B 5/008
438/29
2012/0013654 A1* 1/2012 Yashiro ............ G02F 1/133504
345/690

(Continued)

FOREIGN PATENT DOCUMENTS

CN     101551482 A    10/2009
CN     101750779 A     6/2010
(Continued)

*Primary Examiner* — Jia Pan
(74) *Attorney, Agent, or Firm* — Andrew C. Cheng

(57) ABSTRACT

The present disclosure relates to a display device and a color filter. The color filter includes a dielectric layer and wire grid structures on the dielectric layer, each of the wire grid structures includes a first wire grid unit, a second wire grid unit, a third wire grid unit, and a fourth wire grid unit. The first wire grid unit, the second wire grid unit, the third wire grid unit, and the fourth wire grid unit respectively includes a plurality of wire grids spaced apart from each other. Grid-spaces of the first wire grid unit, the second wire grid unit, the third wire grid unit, and the fourth wire grid unit are different. With such configuration, the white CIE composited by the R sub-pixel, the G sub-pixel, and the B sub-pixel may be matched with the white CIE of the W sub-pixel.

9 Claims, 3 Drawing Sheets

(51) Int. Cl.
*G02B 5/20* (2006.01)
*H01L 27/12* (2006.01)

(52) U.S. Cl.
CPC ...... *G02F 1/1335* (2013.01); *G02F 1/133512* (2013.01); *G02F 1/133528* (2013.01); *H01L 27/124* (2013.01); *G02F 2001/133548* (2013.01)

(58) Field of Classification Search
CPC ... G02F 1/133516; G02F 2001/136222; G02F 2201/52; G02F 2001/133548; G02B 5/3058; G02B 5/18; G02B 27/44; G02B 5/20; G02B 5/201; G09G 3/2003; G09G 2300/0452; G09G 2300/0443; G09G 3/3607; G09G 3/3611; G09G 5/02; H01L 27/322; H01L 27/3213; H01L 27/3218
See application file for complete search history.

(56) References Cited

U.S. PATENT DOCUMENTS

| | | | |
|---|---|---|---|
| 2015/0050804 | A1* | 2/2015 | Lu .......................... G02B 27/44 438/618 |
| 2017/0199420 | A1* | 7/2017 | Shin .................. G02F 1/133504 |

FOREIGN PATENT DOCUMENTS

| | | | |
|---|---|---|---|
| CN | 102103222 | A | 6/2011 |
| CN | 102347348 | A | 2/2012 |
| CN | 102798918 | A | 11/2012 |
| CN | 103837918 | A | 6/2014 |
| CN | 104280935 | A | 1/2015 |
| CN | 105448197 | A * | 3/2016 |
| CN | 105448197 | A | 3/2016 |
| CN | 105866875 | A | 8/2016 |
| JP | 2016018143 | A | 2/2016 |
| TW | 200828214 | A | 7/2008 |
| TW | 200923879 | A | 6/2009 |

* cited by examiner

DISPLAY DEVICES AND THE COLOR FILTERS THEREOF

BACKGROUND OF THE INVENTION

Field of the Invention

The present disclosure relates to touch panel manufacturing technology, and more particularly to a display device and the color filter thereof.

Discussion of the Related Art

RGBW display technology relates to adding a white sub-pixel to the arrangement of RGB photo-resistors. While the transmission rate of the RGB photo-resists is below ⅓, the transmission rate of the W sub-pixel is close to one. That is, the RGBW solution, when compared to the conventional RGB arrangement, is characterized by high brightness and low power consumption. When a white image is displayed by a conventional RGBW liquid crystal device (LCD), the backlight passes through a down polarizer, a glass layer, and a liquid crystal layer. Before the backlight enters the CF layer, the energy distributions of spectrum of the white beams are the same. The white beams composited by the RGB sub-pixels include lights-mixing effect formed by different coloring agents. As RGBW display adopts the same or similar R/G/B photo-resists with the RGB displays, the static R/G/B chromaticity coordinates (CIE) and the color gamut may be adjusted to be the same with the RGB displays. However, as W sub-pixel is formed by only one material, usually, the CIEs of the white beams may not be precisely adjusted for the reason that the conventional OC material is adopted. The energy distributions of spectrum of the white beams and the coordinate of the white points may be different. Thus, appropriate solution has to be adopted to match the white CIEs of the white beams composited by the RGB sub-pixels and the white CIEs of the white beams.

SUMMARY

To overcome the above problems, a display device and the color filter thereof are proposed to match the white CIEs composited by the R, G, and B sub-pixels with the white CIE of the W sub-pixel.

In one aspect, a color filter includes: an dielectric layer and a wire grid structure array arranged on the dielectric layer, wherein the wire grid structure array includes a plurality of wire grid structures, each of the wire grid structures includes a first wire grid unit, a second wire grid unit, a third wire grid unit, and a fourth wire grid unit, and the first wire grid unit, the second wire grid unit, the third wire grid unit, and the fourth wire grid unit respectively includes a plurality of wire grids spaced apart from each other, wherein grid-spaces of the first wire grid unit, the second wire grid unit, the third wire grid unit, and the fourth wire grid unit are different, and the first wire grid unit, the second wire grid unit, the third wire grid unit, and the fourth wire grid unit are configured to respectively filter incident light beams to obtain light beams of four different colors.

Wherein the grid-spaces of the first wire grid unit, the second wire grid unit, and the third wire grid unit are configured to be gradually decreased in sequence.

Wherein a cross-section of the wire grids along a direction perpendicular to the dielectric layer and the wire grid is square, trapezium, or triangular.

Wherein the wire grid is made by aluminum, silver or gold.

In another aspect, a display device includes: a backlight module, and a down substrate, a liquid crystal layer, and a top substrate arranged on the backlight module in sequence, the top substrate includes a base and a top polarizer on the base, the down substrate includes a down polarizer, and a thin film transistor (TFT) array on the down polarizer, wherein the down substrate further includes the color filter as claimed in claim 1, the color filter is arranged on the TFT array, the wire grid structure array is arranged between the dielectric layer and the liquid crystal layer, the first wire grid unit, the second wire grid unit, the third wire grid unit, and the fourth wire grid unit are respectively configured to filter incident light beams to obtain the R sub-pixel of red color, the G sub-pixel of green color, the B sub-pixel of blue color, and the W sub-pixel of white color.

Wherein the grid-spaces of the first wire grid unit, the second wire grid unit, and the third wire grid unit are configured to be gradually decreased in sequence.

Wherein the incident light beams are filtered by the first wire grid unit to obtain the R sub-pixel, the incident light beams are filtered by the second wire grid unit to obtain the G sub-pixel, the incident light beams are filtered by the third wire grid unit to obtain the B sub-pixel, and the incident light beams are filtered by the fourth wire grid unit to obtain the W sub-pixel.

Wherein lengths of the wire grid of each of the wire grid units are the same.

Wherein gaps between any two adjacent first wire grid unit, the second wire grid unit, the third wire grid unit, and the fourth wire grid unit are the same.

Wherein the display device further includes an over coat (OC) fatten layer between the base and the liquid crystal layer.

In view of the above, the color filter includes the first wire grid unit, the second wire grid unit, the third wire grid unit, and the fourth wire grid unit. By configuring the grid-space between two adjacent wire grids and the width of the wire grids of the first wire grid unit, the second wire grid unit, the third wire grid unit, and the fourth wire grid unit, the white CIE composited by the R sub-pixel, the G sub-pixel, and the B sub-pixel and the white CIE of the W sub-pixel may be matched.

DETAILED DESCRIPTION OF THE EMBODIMENTS

Figure 1:
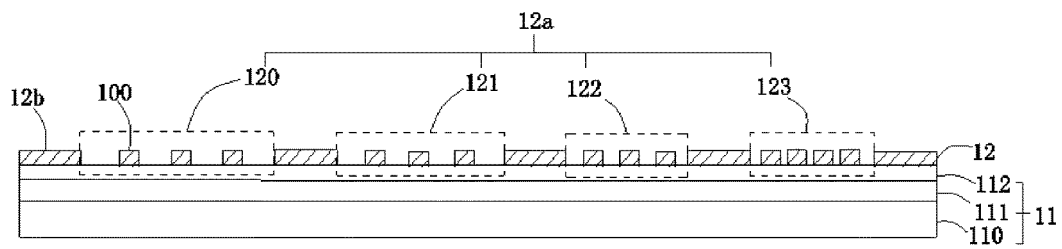
FIG. 1 is a schematic view of the polarizer of the display device in accordance with a first embodiment.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

First Embodiment

Figure 2:
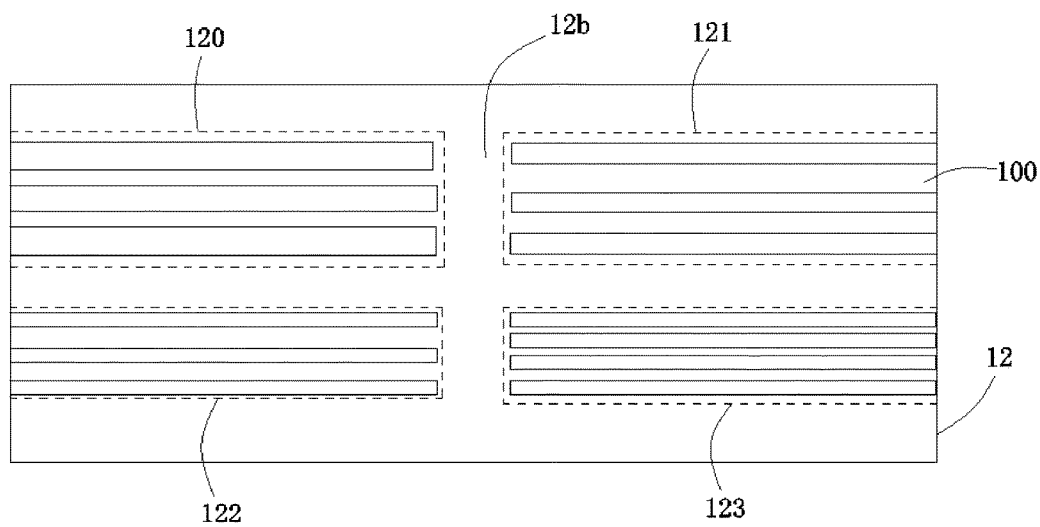
FIG. 2 is a schematic view of the wire grid layer of the polarizer of FIG. 1.

Referring to FIGS. 1 and 2, 1 color filter 1 includes an dielectric layer 11 and a wire grid layer 12 arranged on the dielectric layer 11. The wire grid layer 12 includes a wire grid structure array including a plurality of wire grid structures 12a. FIG. 2 shows an example, wherein the wire grid layer 12 includes a wire grid structure 12a. Each of the wire grid structures 12a includes a first wire grid unit 120, a second wire grid unit 121, a third wire grid unit 122, and a fourth wire grid unit 123. The first wire grid unit 120, the second wire grid unit 121, the third wire grid unit 122, and the fourth wire grid unit 123 respectively includes a plurality of wire grids 100 spaced apart from each other, wherein grid-spaces of the first wire grid unit 120, the second wire grid unit 121, the third wire grid unit 122, and the fourth wire grid unit 123 are different. For the reason, the light beams of four colors may be obtained after the incident light beams are filtered by the first wire grid unit 120, the second wire grid unit 121, the third wire grid unit 122, and the fourth wire grid unit 123.

The dielectric layer 11 is of multilayer dielectric structures modulated by the reflective rates. Preferably, the dielectric layer 11 includes a first reflective-rate modulation layer 110, a second reflective-rate modulation layer 111 on the first reflective-rate modulation layer 110, and a third reflective-rate modulation layer 112 between the second reflective-rate modulation layer 111 and the wire grid layer 12, wherein the reflective-rate of the first reflective-rate modulation layer 110 and the third reflective-rate modulation layer 112 is lower than the reflective-rate of the second reflective-rate modulation layer 111. The first reflective-rate modulation layer 110 and the third reflective-rate modulation layer 112 may be made by $SiO_2$, SiO, and MgO, and the second reflective-rate modulation layer 111 may be made by $Si_3N_4$, $TiO_2$, and $Ta_2O_5$.

Specifically, the grid-spaces of the first wire grid unit 120, the second wire grid unit 121, the third wire grid unit 122, and the fourth wire grid unit 123 are gradually decreased in sequence. The wire grid layer 12 includes a wire grid structure array and a black matrix (BM) unit 12b between the first wire grid unit 120 and the second wire grid unit 121, and between the third wire grid unit 122 and the fourth wire grid unit 123. The BM unit 12b is opaque so as to avoid the optical leakage from lateral sides of the first wire grid unit 120, the second wire grid unit 121, the third wire grid unit 122, and the fourth wire grid unit 123. The width of each of the wire grids 100 and the grid-space between two wire grids within the wire grid unit is the same. The grid-space within different wire grid unit may be different. The wire grid layer 12 may be made by materials having greater imaginary part of reflective index, such as aluminum, silver or gold. Preferably, the wire grid layer 12 may be made by aluminum.

A wire grid period of the first wire grid unit 120, the second wire grid unit 121, the third wire grid unit 122, and the fourth wire grid unit 123 is in a range from 200 nm to 500 nm. The wire grid period relates to a distance between geometric centers of two adjacent wire grids 100. The width of the wire grid 100 is about 0.4~0.9 times than the wire grid period. A height of the wire grid 100 is in a range from 20 to 200 nm. The wire grid 100 is bar-shaped, and the cross-section of the wire grids along a direction perpendicular to the dielectric layer 11 and the wire grid 100 may be square, trapezium, or triangular. The length of the wire grid 100 within different wire grid unit may be the same. By configuring the grid-space between each of the wire grid unit, the width of the wire grid 100, the height of the wire grid 100, and the material of the wire grid 100, the transmission rate of each of the wire grid units may be enhanced, and the light beams of different colors may be obtained.

Figure 3:
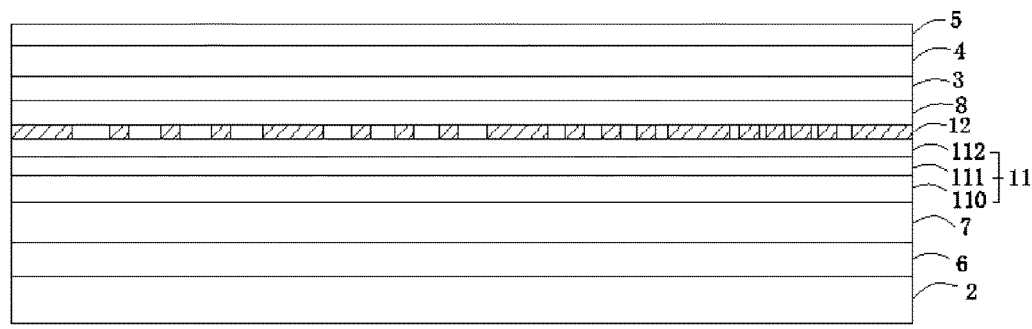
FIG. 3 is a schematic view of the display device in accordance with the first embodiment.

Referring to FIG. 3, a display device includes a backlight module 2 and a down substrate, a liquid crystal layer 3, and a top substrate arranged on the backlight module 2 in sequence. The top substrate includes a base 4 and a top polarizer 5 on the base 4. The down substrate includes a down polarizer 6, the color filter 1, and a TFT array 7. The TFT array 7 is on the down polarizer 6, and the color filter 1 is arranged between the TFT array 7 and the liquid crystal layer 3. The wire grid layer 12 is arranged between the dielectric layer 11 and the liquid crystal layer 3. A polarized direction of the top polarizer 5 is perpendicular to the polarized direction of the down polarizer 6. The backlight module 2 may be of an edge-type backlight module or a direct-lit backlight module. When the light beams emitted from the backlight module 2 enter the wire grid layer 12, the light beams on the BM unit 12b and the wire grid 100 are absorbed, and the rest of the light beams pass the gap between two adjacent wire grids 100 and then are respectively filtered by the first wire grid unit 120, the second wire grid unit 121, the third wire grid unit 122, and the fourth wire grid unit 123 to obtain the R sub-pixel, the G sub-pixel, the B sub-pixel, and the W sub-pixel. For instance, the incident light beams are filtered by the first wire grid unit 120 to obtain the R sub-pixel, the incident light beams are filtered by the second wire grid unit 121 to obtain the G sub-pixel, the incident light beams are filtered by the third wire grid unit 122 to obtain the B sub-pixel, and the incident light beams are filtered by the fourth wire grid unit 123 to obtain the W sub-pixel. In this way, the four R, G, B, W sub-pixels may be obtained after the incident light beams pass through the wire grid structures 12a, and the four sub-pixels constitute one pixel of the display device.

Figure 4:
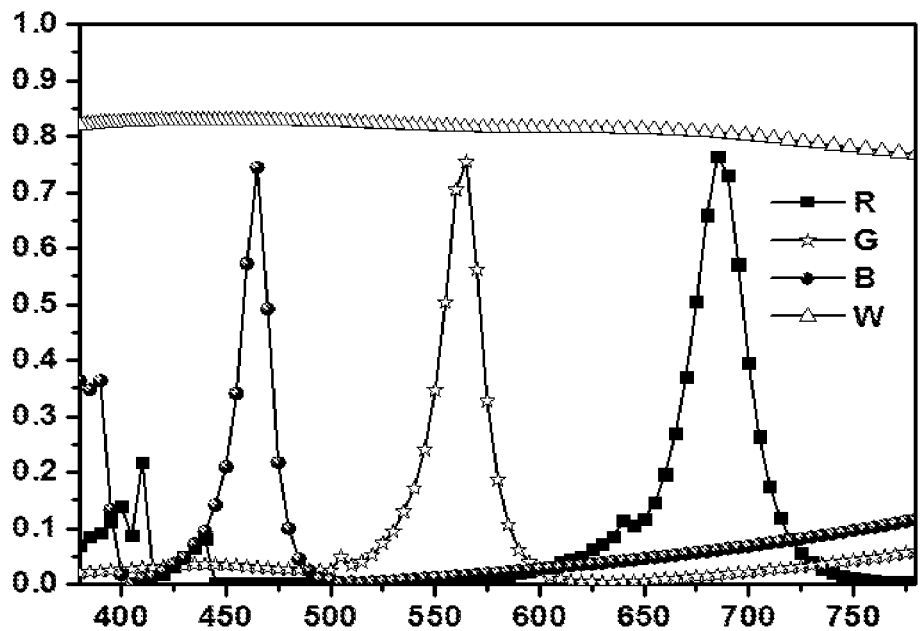
FIG. 4 is a diagram showing transmission rates corresponding to different wavelengths of the R sub-pixel, G sub-pixel, B sub-pixel, and W sub-pixel in accordance with the first embodiment.

Referring to FIG. 4, the wire grid layer 12 of the display device is aluminum. The wire grid period of the first wire grid unit 120 is in a range from 400 to 500 nm, the wire grid period of the second wire grid unit 121 is in a range from 300 to 450 nm, the wire grid period of the third wire grid unit 122 is in a range from 200 to 350 nm, and the wire grid period of the fourth wire grid unit 123 is in a range from 200 to 500 nm. With such configuration, the transmission rate of the central peak corresponding to the red band of the first wire grid unit 120, the transmission rate of the central peak corresponding to the green band of the second wire grid unit 121, and the transmission rate of the central peak corresponding to the blue band of the third wire grid unit 122 is respectively greater than 70%, and the lowest transmission rate outside the band is lower than 10%. The transmission rate for the whole band of the fourth wire grid unit 123 is greater than 70%, wherein the widths of the BM unit 12b between two adjacent first wire grid units 120, two adjacent second wire grid units 121, two adjacent third wire grid units 122, and two adjacent fourth wire grid units 123 are the same.

In addition, the display device also includes an over coat (OC) flatten layer 8 between the wire grid layer 12 and the liquid crystal layer 3. The OC flatten layer 8 covers a top surface of the wire grid layer 12 for increasing the smoothness of the top surface of the wire grid layer 12 and for preventing the liquid crystal layer 3 from being polluted.

In the embodiment, the arrangement of the first wire grid unit 120, the second wire grid unit 121, the third wire grid unit 122, and the fourth wire grid unit 123 of each of the wire grid structures 12a may be configured in accordance with real scenario, that is, FIG. 3 is an example, and the present disclosure is not limited thereto.

In one example, the wire grid layer 12 is made by aluminum, and the height of the wire grid layer 12 is fixed. By configuring the grid-space of each of the wire grid units and the width of the wire grid 100, the matching process between the white CIE composited by the R sub-pixel, the G sub-pixel, and the B sub-pixel, and the white CIE of the W sub-pixel will be described hereinafter.

Figure 5:
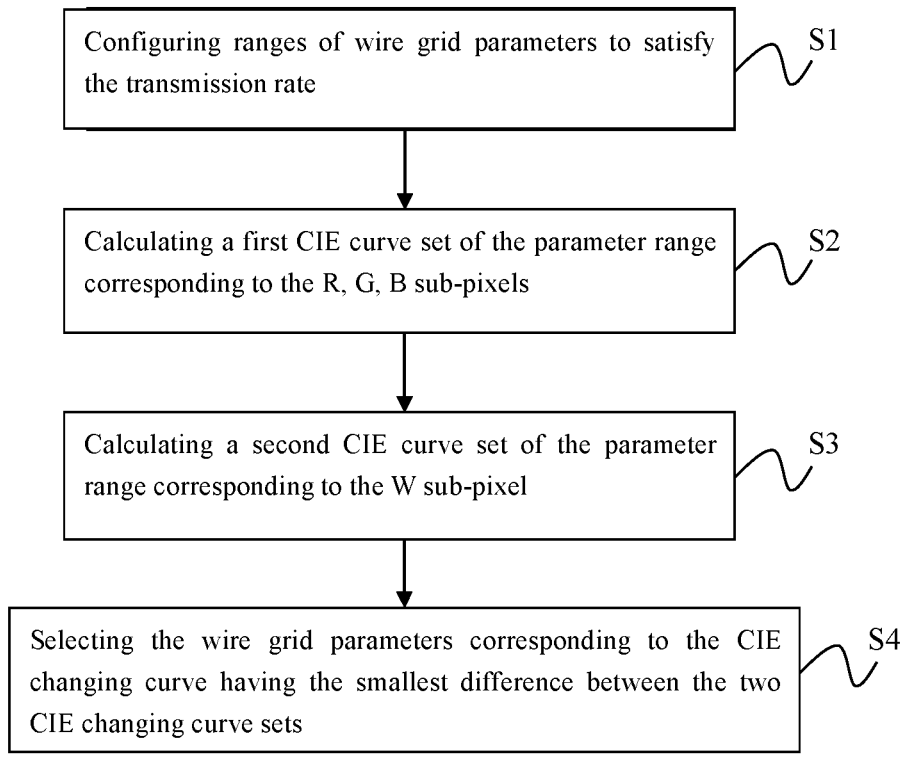
FIG. 5 is a flowchart illustrating the matching method between the white CIE composited by the R sub-pixel, the G sub-pixel, and the B sub-pixel and the white CIE of the W sub-pixel.
Figure 6:
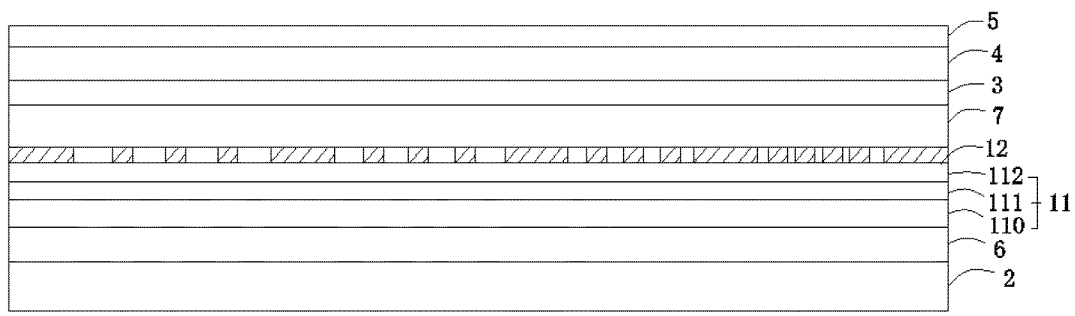
FIG. 6 is a schematic view of the display device in accordance with a second embodiment.

Referring to FIG. 5, the matching process includes the following steps.

In step S1, configuring a transmission rate of a central peak corresponding to a red band of the first wire grid unit 120 to be 70% and configuring a first parameter range wherein a lowest transmission rate outside the band is lower than 10%, configuring the transmission rate of the central peak corresponding to a green band of the second wire grid unit 121 to be greater than 70% and configuring a second parameter range wherein the lowest transmission rate outside the band is lower than 10%, configuring the transmission rate of the central peak corresponding to a blue band of the third wire grid unit 122 to be greater than 70% and configuring a third parameter range wherein the lowest transmission rate outside the band is lower than 10%, configuring the transmission rate of a whole band corresponding to visible light beams of the fourth wire grid unit 123 to be greater than 70% and configuring a fourth parameter range. The above parameters include the wire grid period and a duty cycle ratio of the wire grid unit, wherein the duty cycle ratio relates to a ratio of the width of the wire grid 100 to the wire grid period.

In step S2, selecting different parameters from the first, the second, and the third parameter ranges, calculating a CIE changing curve with respect to different grayscales, and the white CIE is composited by the selected parameters regarding the R sub-pixel, the G sub-pixel, and the B sub-pixel so as to obtain a first CIE changing curve set of the R sub-pixel, the G sub-pixel, and the B sub-pixel within the first, the second, and the third parameter range.

In step S3, selecting different parameters from the fourth parameter range, calculating the CIE changing curve with respect to the different grayscales, and the white CIE is determined by the selected parameter to obtain a second CIE changing curve set of the W sub-pixel within the fourth parameter range.

In step S4, selecting the parameters corresponding to the two CIE changing curves having the smallest difference between the first CIE changing curve set and the second CIE changing curve set to be wire grid parameters of the first wire grid unit 120, the second wire grid unit 121, the third wire grid unit 122, and the fourth wire grid unit 123 so as to match the white CIE composited by the R sub-pixel, the G sub-pixel, and the B sub-pixel and the white CIE of the W sub-pixel.

By configuring the grid-space between each of the wire grid units, the width of the wire grid, the height of the wire grid, and the material of the wire grid, the transmission rate of each of the wire grid units may be enhanced, and the light beams of different colors may be obtained. In addition, the white CIE composited by the R sub-pixel, the G sub-pixel, and the B sub-pixel and the white CIE of the W sub-pixel may be matched so as to enhance the white-point drifting issue of the display device.

Second Embodiment

The difference between this embodiment and the first embodiment resides in that the color filter 1 is arranged between the TFT array 7 and the down polarizer 6, and the wire grid layer 12 is arranged between the dielectric layer 11 and the TFT array 7.

The display device also includes similar performance with the display device in the first embodiment. In addition, by configuring the color filter 1 to be between the TFT array 7 and the down polarizer 6, the OC flatten layer 8 in the first embodiment may be excluded. In addition, the liquid crystal layer 3 is prevented from being polluted by the wire grid layer 12 by separating the color filter 1 from the liquid crystal layer 3 by the TFT array.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A color filter, comprising:
a dielectric layer comprising a first reflective-rate modulation layer, a second reflective-rate modulation layer and a third reflective-rate modulation layer, wherein the second reflective-rate modulation layer is arranged between the first reflective-rate modulation layer and the third reflective-rate modulation layer, wherein the reflective-rate of the second reflective-rate modulation layer is higher than the reflective rate of the first reflective-rate modulation layer and the third reflective-rate modulation layer; and
a wire grid structure array arranged on the dielectric layer, wherein the wire grid structure array comprises a plurality of wire grid structures, each of the plurality of wire grid structures comprises a first wire grid unit, a second wire grid unit, a third wire grid unit, and a fourth wire grid unit, and the first wire grid unit, the second wire grid unit, the third wire grid unit, and the fourth wire grid unit respectively comprises a plurality of wire grids spaced apart from each other, wherein grid-spaces of the first wire grid unit, the second wire grid unit, the third wire grid unit, and the fourth wire grid unit are different, and the first wire grid unit, the second wire grid unit, the third wire grid unit, and the fourth wire grid unit are configured to respectively filter incident light beams to obtain light beams of four different colors.

2. The color filter as claimed in claim 1, wherein the grid-spaces of the first wire grid unit, the second wire grid unit, and the third wire grid unit are configured to be gradually decreased in sequence.

3. The color filter as claimed in claim 2, wherein a cross-section of the wire grids along a direction perpendicular to the dielectric layer and the wire grid is square, trapezium, or triangular.

4. The color filter as claimed in claim 1, wherein the wire grid is made by aluminum, silver or gold.

5. A display device, comprising:
a backlight module, and a down substrate, a liquid crystal layer, and a top substrate arranged on the backlight module in sequence, the top substrate comprises a base and a top polarizer on the base, the down substrate comprises a down polarizer, and a thin film transistor (TFT) array on the down polarizer, wherein the down substrate further comprises the color filter as claimed in claim 1, the color filter is arranged on the TFT array, the wire grid structure array is arranged between the dielectric layer and the liquid crystal layer, the first wire grid unit, the second wire grid unit, the third wire grid unit, and the fourth wire grid unit are respectively configured to filter incident light beams to obtain the R sub-pixel of red color, the G sub-pixel of green color, the B sub-pixel of blue color, and the W sub-pixel of white color.

6. The display device as claimed in claim 5, wherein the grid-spaces of the first wire grid unit, the second wire grid unit, and the third wire grid unit are configured to be gradually decreased in sequence.

7. The display device as claimed in claim 6, wherein the incident light beams are filtered by the first wire grid unit to obtain the R sub-pixel, the incident light beams are filtered by the second wire grid unit to obtain the G sub-pixel, the incident light beams are filtered by the third wire grid unit to obtain the B sub-pixel, and the incident light beams are filtered by the fourth wire grid unit to obtain the W sub-pixel.

8. The display device as claimed in claim 5, wherein lengths of the wire grid of each of the wire grid units are the same.

9. The display device as claimed in claim 5, wherein gaps between any two adjacent first wire grid unit, the second wire grid unit, the third wire grid unit, and the fourth wire grid unit are the same.

* * * * *